(12) United States Patent
Seok et al.

(10) Patent No.: US 12,506,100 B2
(45) Date of Patent: Dec. 23, 2025

(54) SEMICONDUCTOR CHIP

(71) Applicant: Samsung Electronics Co., Ltd., Suwon-si (KR)

(72) Inventors: Seyeong Seok, Cheonan-si (KR); Dongwoo Kim, Cheonan-si (KR); Hosin Song, Hwaseong-si (KR); Jonghyeon Chang, Pyeongtaek-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 879 days.

(21) Appl. No.: 17/722,630

(22) Filed: Apr. 18, 2022

(65) Prior Publication Data

US 2023/0057061 A1    Feb. 23, 2023

(30) Foreign Application Priority Data

Aug. 18, 2021   (KR) .......................... 10-2021-0108963

(51) Int. Cl.
| | |
|---|---|
| *H01L 23/00* | (2006.01) |
| *H01L 23/538* | (2006.01) |
| *H01L 25/065* | (2023.01) |
| *H01L 25/10* | (2006.01) |

(52) U.S. Cl.
CPC .......... *H01L 24/17* (2013.01); *H01L 23/5386* (2013.01); *H01L 24/16* (2013.01); *H01L 25/0655* (2013.01); *H01L 25/105* (2013.01); *H01L 2224/16245* (2013.01); *H01L 2224/1713* (2013.01); *H01L 2224/17143* (2013.01); *H01L 2224/17177* (2013.01); *H01L 2225/1058* (2013.01); *H01L 2225/107* (2013.01); *H01L 2924/381* (2013.01)

(58) Field of Classification Search
None
See application file for complete search history.

(56) References Cited

U.S. PATENT DOCUMENTS

| | | | |
|---|---|---|---|
| 8,405,209 B2 | 3/2013 | Takeda | |
| 10,262,933 B2 | 4/2019 | Cho et al. | |
| 10,734,350 B2 | 8/2020 | Honda et al. | |
| 11,257,725 B2 | 2/2022 | Kim et al. | |
| 2010/0308442 A1* | 12/2010 | Naka | ...... H01L 24/11 257/E23.179 |
| 2020/0098592 A1 | 3/2020 | Okamoto et al. | |
| 2020/0335466 A1 | 10/2020 | Schwartz et al. | |

FOREIGN PATENT DOCUMENTS

| | | |
|---|---|---|
| JP | 2011-222807 A | 11/2011 |
| KR | 10-2018-0125718 A | 11/2018 |
| KR | 10-2020-0037079 A | 4/2020 |
| KR | 2021-0072178 A | 6/2021 |

* cited by examiner

*Primary Examiner* — Hung K Vu
(74) *Attorney, Agent, or Firm* — Harness, Dickey & Pierce, P.L.C.

(57) ABSTRACT

A semiconductor chip that includes a chip body that has a first side surface, a second side surface, a third side surface, and a fourth side surface; a central region at a central portion of the chip body; and a peripheral region at a peripheral portion of the chip body and adjacent to at least one of the first side surface to the fourth side surface, wherein the peripheral region includes a first unit region that includes a plurality of first bumps of a first bump density, and a second unit region that includes a plurality of second bumps of a second bump density higher than the first bump density.

20 Claims, 20 Drawing Sheets

SEMICONDUCTOR CHIP

CROSS-REFERENCE TO RELATED APPLICATION

This application is based on and claims priority under 35 U.S.C. § 119 to Korean Patent Application No. 10-2021-0108963, filed on Aug. 18, 2021, in the Korean Intellectual Property Office, the disclosure of which is incorporated by reference herein in its entirety.

BACKGROUND

The inventive concepts relate to a semiconductor chip, and more particularly, to a semiconductor chip including bumps.

A plurality of semiconductor chips may be fabricated by performing various semiconductor processes on a semiconductor wafer. Bumps and an adhesive layer are sequentially formed on each of the semiconductor chips fabricated on the semiconductor wafer, and then a single semiconductor chip may be completed through a singulation process. An arrangement form of the bumps formed on each of the semiconductor chips affects the reliability of an adhesive layer attachment process, and furthermore greatly affects the reliability of a semiconductor package.

SUMMARY

The inventive concepts provide a semiconductor chip including bumps having the most appropriate arrangement form.

According to an aspect of the inventive concepts, a semiconductor chip includes a chip body that has a first side surface on an upper side, a second side surface on a lower side, a third side surface on a left side, and a fourth side surface on a right side; a central region at a central portion of the chip body; and a peripheral region at a peripheral portion of the central region and adjacent to at least one of the first side surface to the fourth side surface, wherein the peripheral region includes a first unit region that includes a plurality of first bumps of a first bump density, and a second unit region that includes a plurality of second bumps of a second bump density higher than the first bump density.

According to another aspect of the inventive concepts, a semiconductor chip includes a chip body that has a first side surface on an upper side, a second side surface on a lower side, a third side surface on a left side, and a fourth side surface on a right side; a central region at a central portion of the chip body; and a peripheral region at a peripheral portion of the central region and adjacent to at least one of the first side surface to the fourth side surface, wherein the peripheral region includes a plurality of first unit regions that include a plurality of first bumps of a first bump density, and a plurality of second unit regions that include a plurality of second bumps of a second bump density higher than the first bump density, and the first unit regions and the second unit regions are sequentially and repeatedly arranged along at least one of the first side surface to the fourth side surface.

According to another aspect of the inventive concepts, a semiconductor chip includes a chip body having a first side surface on an upper side, a second side surface on a lower side, a third side surface on a left side, and a fourth side surface on a right side; a central region at a central portion of the chip body; and a first peripheral region to a fourth peripheral region respectively adjacent to the first side surface to the fourth side surface, wherein the first peripheral region to the fourth peripheral region each include a first unit region including a plurality of first bumps of a first bump density, and a second unit region that includes a plurality of second bumps of a second bump density higher than the first bump density, and the central region includes a plurality of third bumps of a third bump density equal to the second bump density.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments of the inventive concepts will be described in detail with reference to the accompanying drawings. The following embodiments of the inventive concepts may also be implemented by only one, and the following embodiments may also be implemented by combining one or more. Accordingly, the inventive concepts are not construed as being limited to one embodiment.

In the present specification, a singular form of the elements may include a plural form unless the context clearly indicates otherwise. In the present specification, the drawings are exaggerated to more clearly illustrate the inventive concepts.

Figure 1:
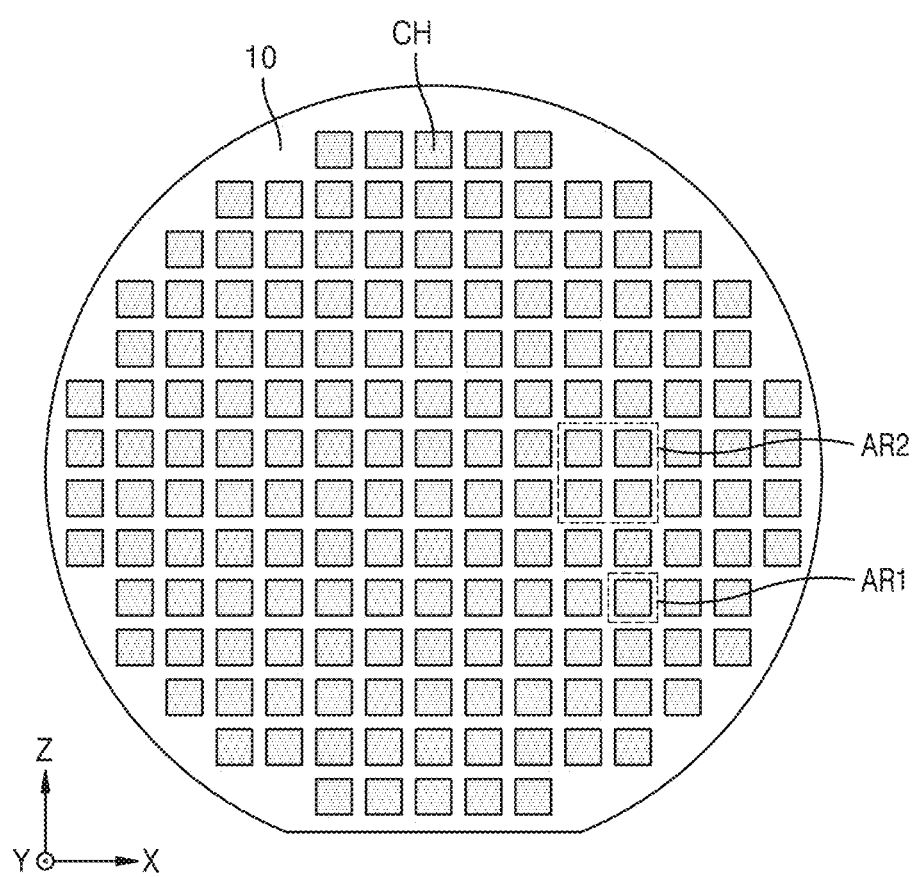
FIG. 1 is a plan view of a wafer illustrating a semiconductor chip according to an embodiment of the inventive concepts.

FIG. 1 is a plan view of a wafer illustrating a semiconductor chip according to an embodiment of the inventive concepts.

In detail, a plurality of semiconductor chips CH may be provided to be separated from each other on a wafer 10. The semiconductor chips CH may be fabricated through various semiconductor processes. The wafer 10 may include a semiconductor material, for example, a semiconductor element such as silicon or germanium (Ge), or a compound semiconductor such as silicon carbide (SiC), gallium arsenide (GaAs), indium arsenide (InAs), or indium phosphide (InP).

In some embodiments, the semiconductor chips CH may each include an individual device. The individual device may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, a passive device, and so on.

In some embodiments, the semiconductor chips CH may each include a logic chip, a power management integrated circuit (PMIC chip), or a memory chip. In some embodiments, the logic chip may include a memory controller chip, a central processing unit (CPU) chip, a graphics processing unit (GPU) chip, or an application processor (AP) chip.

In some embodiments, the memory chip may include a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The semiconductor chips CH formed on the wafer 10 may become one semiconductor chip CH indicated by reference numeral AR1 of FIG. 1 through a singulation process. For the sake of convenient description, the semiconductor chips CH are described hereinafter by using one semiconductor chip CH indicated by the reference numeral AR1 of FIG. 1, and a semiconductor process of the wafer 10 is described by using four semiconductor chips CH indicated by reference numeral AR2 of FIG. 1.

Figure 2:
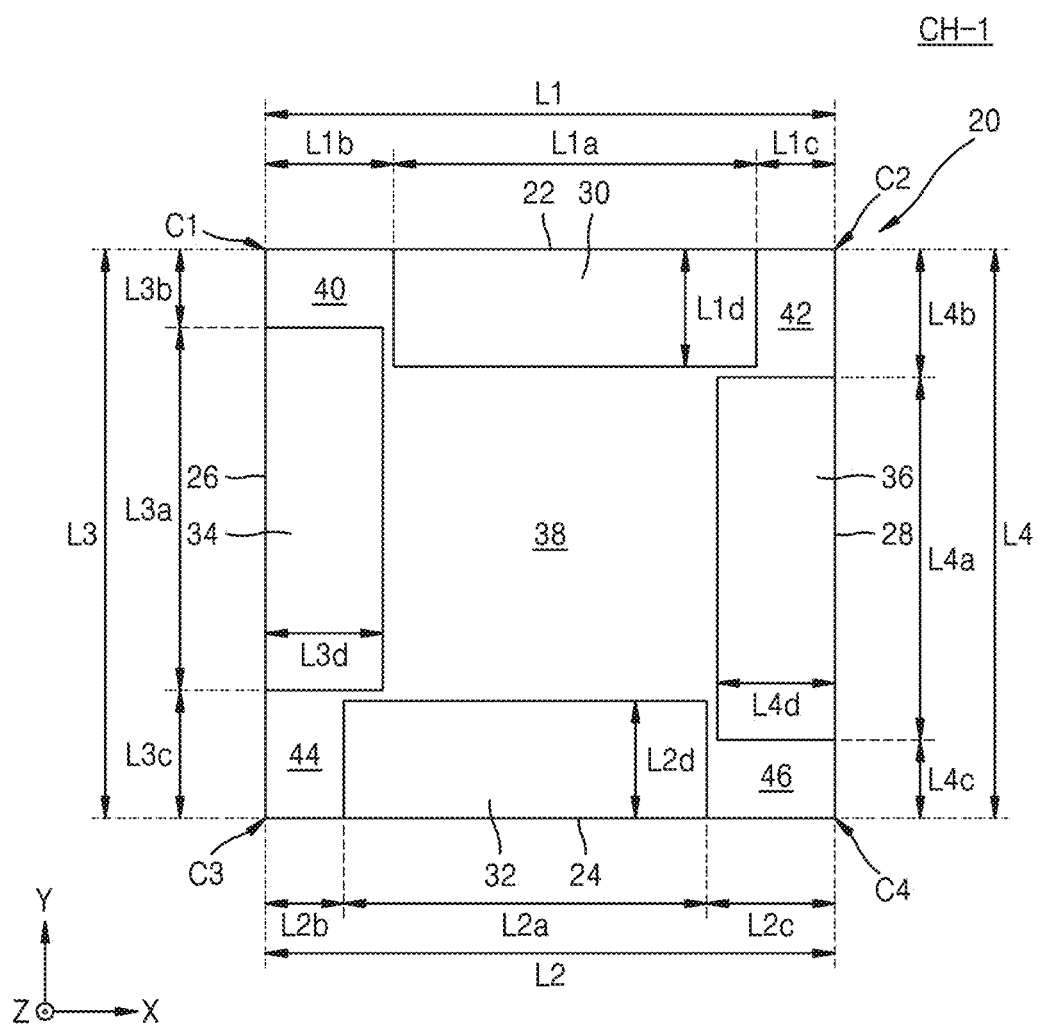
FIG. 2 is a diagram illustrating a layout of bumps provided in a semiconductor chip according to an embodiment of the inventive concepts.

FIG. 2 is a diagram illustrating a layout of bumps provided in a semiconductor chip according to an embodiment of the inventive concepts.

Specifically, FIG. 2 may be a layout view (arrangement view) of a plurality of bumps (not illustrated) provided on a semiconductor chip CH-1. The semiconductor chip CH-1 may be one of the semiconductor chips CH described above. The semiconductor chip CH-1 may include a chip body 20. The chip body 20 may be the wafer 10 of FIG. 1.

The chip body 20 may include a first side surface 22 on an upper side, a second side surface 24 on a lower side, a third side surface 26 on a left side, and a fourth side surface 28 on a right side. The first side surface 22 and the second side surface 24 may be arranged in a vertical direction, that is, a Y direction as viewed in FIG. 2. The third side surface 26 and the fourth side surface 28 may be arranged in the horizontal direction, that is, an X direction as viewed in FIG. 2. The terms "horizontal" and "vertical" as well as the terms "upper side", "lower side", "left side" and "right side" as used herein are used relative to the FIGURE being referenced.

The first side surface 22, the second side surface 24, the third side surface 26, and the fourth side surface 28 are divided for the sake of convenient description. The chip body 20 may have a rectangular shape. The chip body 20 may have a square shape. In FIGS. 1 and 2, the chip body 20 is illustrated in a square shape for the sake of convenience.

A plurality of bumps (not illustrated) may be arranged on the chip body 20. In relation to the arrangement of the bumps, the chip body 20 may have divided regions as follows.

A central region 38 may be located at a central portion of the chip body 20. Peripheral regions 30, 32, 34, and 36 may be located in the periphery of the chip body 20. The peripheral regions 30, 32, 34, and 36 may be located peripheral to the central region 38.

The peripheral regions 30, 32, 34, and 36 may be located in portions adjacent to the first to fourth side surfaces 22, 24, 26, and 28. Although the peripheral regions 30, 32, 34, and 36 are illustrated adjacent to the first to fourth side surfaces 22, 24, 26, and 28 in FIG. 1, the peripheral regions 30, 32, 34, and 36 may also be located only at portions adjacent to at least one of the first to fourth side surfaces 22, 24, 26, and 28, if necessary. In other words, the semiconductor chip CH-1 may include only one of the peripheral regions 30, 32, 34, and 36.

The peripheral regions 30, 32, 34, and 36 may be respectively referred to as a first peripheral region 30 adjacent to the first side surface 22, a second peripheral region 32 located on the second side surface 24, a third peripheral region 34 adjacent to the third side surface 26, and a fourth peripheral region 36 located on the fourth side surface 28.

The first peripheral region 30 may be offset so as not to coincide with the second peripheral region 32 in the vertical direction, that is, in the Y direction. The first peripheral region 30 may be shifted in the right direction, that is, in the X direction, compared to the second peripheral region 32.

The third peripheral region 34 may be offset so as not to coincide with the fourth peripheral region 36 in the horizontal direction, that is, in the X-direction. The third peripheral region 34 may be shifted in an upward direction, that is, in the Y direction, compared to the fourth peripheral region 36.

The semiconductor chip CH-1 may include a plurality of corner regions 40, 42, 44, and 46 arranged in portions adjacent to corners of the chip body 20. The corner regions 40, 42, 44, and 46 may be respectively referred to as a first corner region 40 adjacent to a first corner C1 between the first side surface 22 and the third side surface 26, a second corner region 42 adjacent to a second corner C2 between the first side surface 22 and the fourth side surface 28, a third corner region 44 adjacent to a third corner C3 between the second side surface 24 and the third side surface 26, and a fourth corner region 46 adjacent to a fourth corner C4 between the second side surface 24 and the fourth side surface 28.

The first side surface 22 may have a first horizontal length L1, as viewed in FIG. 2. The first horizontal length L1 may be the sum of a first sub-horizontal length L1$a$ of the first peripheral region 30, a second sub-horizontal length L1$b$ of the first corner region 40, and a third sub-horizontal length L1*c* of the second corner region 42.

In some embodiments, the second sub-horizontal length L1*b* may be greater than the third sub-horizontal length L1*c*. The first peripheral region 30 may have a first peripheral vertical length L1*d*, as viewed in FIG. 2. In some embodiments, the first peripheral vertical length L1*d* may be greater than a second sub-vertical length L3*b* and less than a fifth sub-vertical length L4*b*. In some embodiments, the first peripheral vertical length L1*d* may be about 8% to about 23% of a first vertical length L3 or a second vertical length L4.

In some embodiments, the first sub-horizontal length L1*a* may be about 50% to about 80% of the first horizontal length L1. For example, the first horizontal length L1 may be about 5,000 μm to about 20,000 and the first sub-horizontal length L1*a* may be about 2500 μm to about 16,000 μm.

The second sub-horizontal length L1*b* and the third sub-horizontal length L1*c* may be about 10% to about 25% of the first horizontal length L1. For example, the first horizontal length L1 may be about 5,000 μm to about 20,000 and the second sub-horizontal length L1*b* and the third sub-horizontal length L1*c* may be about 500 μm to about 4,000 μm.

The second side surface 24 may have a second horizontal length L2. The second horizontal length L2 may be the sum of a fourth sub-horizontal length L2*a* of the second peripheral region 32, a fifth sub-horizontal length L2*b* of the third corner region 44, and a sixth sub-horizontal lengths L2*c* of the fourth corner region 46.

In some embodiments, the fifth sub-horizontal length L2*b* may be less than the sixth sub-horizontal length L2*c*. In some embodiments, the second peripheral region 32 may have a second peripheral vertical length L2*d*. The second peripheral vertical length L2*d* may be greater than a sixth sub-vertical length L4*c* and less than a third sub-vertical length L3*c*. In some embodiments, the second peripheral vertical length L2*d* may be about 8% to about 23% of the first vertical length L3 or the second vertical length L4.

The second horizontal length L2 may correspond to the first horizontal length L1. The second horizontal length L2 may be equal to the first horizontal length L1. The fourth sub-horizontal length L2*a* may correspond to the first sub-horizontal length L1*a*. The fourth sub-horizontal length L2*a* may be equal to the first sub-horizontal length L1*a*.

The fifth sub-horizontal length L2*b* and the sixth sub-horizontal length L2*c* may respectively correspond to the third sub-horizontal length L1*c* and the second sub-horizontal length L1*b*. The fifth sub-horizontal length L2*b* and the sixth sub-horizontal length L2*c* may be respectively equal to the third sub-horizontal length L1*c* and the second sub-horizontal length L1*b*.

The third side surface 26 may have the first vertical length L3. The first vertical length L3 may be the sum of a first sub-vertical length L3*a* of the third peripheral region 34, a second sub-vertical length L3*b* of the first corner region 40, and a third sub-vertical length L3*c* of the third corner region 44. In some embodiments, the third sub-vertical length L3*c* may be greater than the second sub-vertical length L3*b*.

In some embodiments, the third peripheral region 34 may have a third peripheral horizontal length L3*d*. The third peripheral horizontal length L3*d* may be greater than the fifth sub-horizontal length L2*b* and less than the second sub-horizontal length L1*b*. The third peripheral horizontal length L3*d* may be about 8% to about 23% of the first horizontal length L1 or the second horizontal length L2.

In some embodiments, the first sub-vertical length L3*a* may be about 50% to about 80% of the first vertical length L3. For example, the first vertical length L3 may be about 5,000 μm to about 20,000 and the first sub-vertical length L3*a* may be about 2500 μm to about 16,000 μm.

The second sub-vertical length L3*b* and the third sub-vertical length L3*c* may be about 10% to about 25% of the first vertical length L3. For example, the first vertical length L3 may be about 5,000 μm to about 20,000 and the second sub-vertical length L3*b* and the third sub-vertical length L3*c* may be about 500 μm to about 4,000 μm.

The fourth side surface 28 may have the second vertical length L4. The second vertical length L4 may be the sum of a fourth sub-vertical length L4*a* of the fourth peripheral region 36, a fifth sub-vertical length L4*b* of the second corner region 42, and a sixth sub-vertical length L4*c* of the fourth corner region 46. In some embodiments, the fifth sub-vertical length L4*b* may be greater than the sixth sub-vertical length L4*c*.

In some embodiments, the fourth peripheral region 36 may have a fourth peripheral transverse length L4*d*. The fourth peripheral horizontal length L4*d* may be greater than the third sub-horizontal length L1*c* and less than the sixth sub-horizontal length L2*c*. The fourth peripheral horizontal length L4*d* may be about 8% to about 23% of the first horizontal length L1 or the second horizontal length L2.

The second vertical length L4 may correspond to the first vertical length L3. The second vertical length L4 may be equal to the first vertical length L3. The fourth sub-vertical length L4*a* may correspond to the first sub-vertical length L3*a*. The fourth sub-vertical length L4*a* may be equal to the first sub-vertical length L3*a*.

The fifth sub-vertical length L4*b* and the sixth sub-vertical length L4*c* may respectively correspond to the third sub-vertical length L3*c* and the second sub-vertical length L3*b*. The fifth sub-vertical length L4*b* and the sixth sub-vertical length L4*c* may respectively equal to the third sub-vertical length L3*c* and the second sub-vertical length L3*b*.

The semiconductor chip CH-1 described above has a bump density of bumps for each region, for example, the central region 38, the peripheral regions 30, 32, 34, and 36, and the corner regions 40, 42, 44, and 46.

When the bump density of bumps for each region of the semiconductor chip CH-1 is increased, adhesion reliability is increased in an adhesive layer attaching process to be described below, and thus, the reliability of a semiconductor package may be increased. Hereinafter, the bump density of bumps differently arranged in each region of the semiconductor chip CH-1 will be described in more detail.

Figure 3:
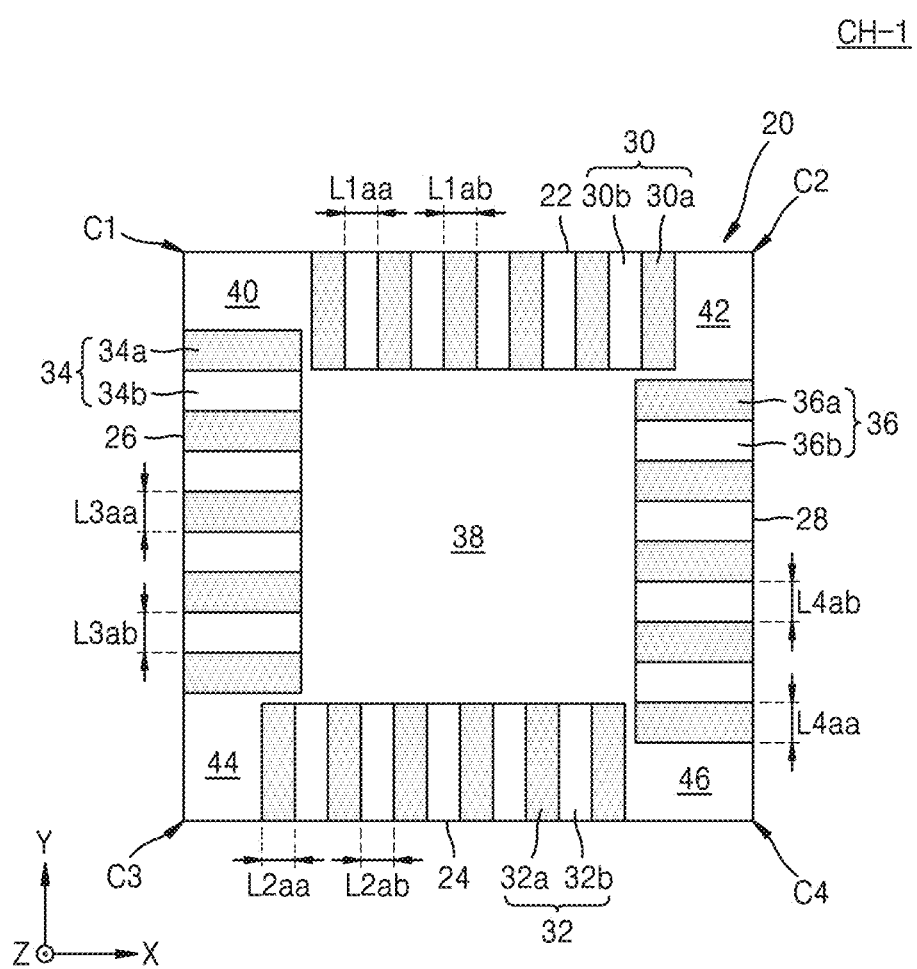
FIG. 3 is a diagram illustrating the bump density of bumps differently arranged in each region of the semiconductor chip according to an embodiment of the inventive concepts.

FIG. 3 is a diagram illustrating the bump density of bumps differently arranged in each region of the semiconductor chip according to an embodiment of the inventive concepts.

Specifically, in FIG. 3, the same reference numerals as in FIG. 2 denote the same members. In FIG. 3, the same description as in FIG. 2 is briefly given below or omitted for the sake of convenience. In the semiconductor chip CH-1, the central region 38 may be located at a central portion of the chip body 20, and the first to fourth peripheral regions 30, 32, 34, and 36 may be located around the central region 38. The first to fourth peripheral regions 30, 32, 34, and 36 may be located in portions adjacent to the first to fourth side surfaces 22, 24, 26, and 28, respectively.

The first to fourth peripheral regions 30, 32, 34, and 36 may respectively include a plurality of first unit regions 30*a*, 32*a*, 34*a*, and 36*a* and second unit regions 30*b*, 32*b*, 34*b*, and 36*b*. The first unit regions 30*a*, 32*a*, 34*a*, and 36*a* may include a plurality of first bumps of a first bump density, for example, a low bump density. The second unit regions 30*b*, 32*b*, 34*b*, and 36*b* may include a plurality of second bumps of a second bump density higher than the first bump density, for example, a high bump density.

In the first peripheral region 30, the first unit regions 30a and the second unit regions 30b may be sequentially and repeatedly arranged along the first side surface 22. In the second peripheral region 32, the first unit regions 32a and the second unit regions 32b may be sequentially and repeatedly arranged along the second side surface 24.

In the third peripheral region 34, the first unit regions 34a and the second unit regions 34b may be sequentially and repeatedly arranged along the third side surface 26. In the fourth peripheral region 36, the first unit regions 36a and the second unit regions 36b may be sequentially and repeatedly arranged along the fourth side surface 28.

The present embodiment describes that the first unit regions 30a, 32a, 34a, and 36a and the second unit regions 30b, 32b, 34b, and 36b are repeatedly arranged in each of the first to fourth peripheral regions 30, 32, 34, and 36, but the first unit regions 30a, 32a, 34a, and 36a and the second unit regions 30b, 32b, 34b, and 36b may be repeatedly arranged in only one or more of the first to fourth peripheral regions 30, 32, 34, and 36.

The central region 38 may include a plurality of third bumps of a third bump density equal to the second bump density, for example, a high bump density. The first to fourth corner regions 40, 42, 44, and 46 may include a plurality of fourth bumps of a fourth bump density equal to the second bump density, for example, a high bump density. The first bump density that is a low bump density and the second to fourth bump density that are a high bump density will be described in detail below.

Here, the first to fourth peripheral regions 30, 32, 34, and 36 will be described in more detail.

In the first peripheral region 30, the first unit region 30a and the second unit region 30b may respectively have a first unit horizontal length L1aa and a second unit horizontal length L1ab. Each of the first unit horizontal length L1aa and the second unit horizontal length L1ab may be about 4% to about 7% of the first sub-horizontal length L1a of FIG. 2. For example, when the first sub-horizontal length L1a in FIG. 2 is about 2,500 µm to about 16,000 µm, the first unit horizontal length L1aa and the second unit horizontal length L1ab may be respectively about 100 µm to about 1,120 µm.

In the second peripheral region 32, the first unit region 32a and the second unit region 32b may respectively have a third unit horizontal length L2aa and a fourth unit horizontal length L2ab. The third unit horizontal length L2aa and the fourth unit horizontal length L2ab may respectively correspond to the first unit horizontal length L1aa and the second unit horizontal length L1ab.

In some embodiments, the third unit horizontal length L2aa and the fourth unit horizontal length L2ab may be respectively about 4% to about 7% of the second sub-horizontal length L2a of FIG. 2. For example, when the second sub-horizontal length L2a in FIG. 2 is about 2,500 µm to about 16,000 µm, the third unit horizontal length L2aa and the fourth unit horizontal length L2ab may be respectively about 100 µm to about 1,120 µm.

The first unit region 30a and the second unit region 30b of the first peripheral region 30 may be respectively referred to as a first sub-region 30a and a second sub-region 30b. The first unit region 32a and the second unit region 32b of the second peripheral region 32 may be respectively referred to as a first sub-region 32a and a second sub-region 32b. As illustrated in FIG. 3, the first sub-region 30a and the second sub-region 30b of the first peripheral region 30 are offset respectively from the first sub-region 32a and the second sub-region 32b of the second peripheral region 32 in the vertical direction, that is, in the Y direction.

In the third peripheral region 34, the first unit region 34a and the second unit region 34b may respectively have a first unit vertical length L3aa and a second unit vertical length L3ab. Each of the first unit vertical length L3aa and the second unit vertical length L13b may be about 4% to about 7% of the first sub-vertical length L3a of FIG. 2. For example, when the first sub-vertical length L3a in FIG. 2 is about 2,500 µm to about 16,000 µm, the first unit vertical length L3aa and the second unit vertical length L3ab may be respectively about 100 µm to about 1,120 µm.

In the fourth peripheral region 36, the first unit region 36a and the second unit region 33b may respectively have a third unit vertical length L4aa and a fourth unit vertical length L4ab. The third unit vertical length L4aa and the fourth unit vertical length L4ab may respectively correspond to the first unit vertical length L3aa and the second unit vertical length L3ab.

In some embodiments, each of the third unit vertical length L4aa and the fourth unit vertical length L4ab may be about 4% to about 7% of the fourth sub-vertical length L4a of FIG. 2. For example, when the fourth sub-horizontal length L4a in FIG. 2 is about 2,500 µm to about 16,000 µm, the third unit vertical length L4aa and the fourth unit vertical length L4ab may be respectively about 100 µm to about 1,120 µm.

The first unit region 34a and the second unit region 34b of the third peripheral region 34 may be respectively referred to as a fifth sub-region 34a and a sixth sub-region 34b. The first unit region 36a and the second unit region 36b of the fourth peripheral region 36 may be respectively referred to as a seventh sub-region 36a and an eighth sub-region 36b. As illustrated in FIG. 3, the fifth sub-region 34a and the sixth sub-region 34b of the third peripheral region 34 are offset respectively from the seventh sub-region 36a and the eight sub-region 36b of the fourth peripheral region 36 in the horizontal direction, that is, in the X-direction, so as not to coincide with each other.

The semiconductor chip CH-1 may include second to fourth bumps of a high bump density, that is, second to fourth bump densities, in the central region 38 and the first to fourth corner regions 40, 42, 44, and 46. The semiconductor chip CH-1 may include all of the first bumps of a low bump density, that is, the first bump density, in the first to fourth peripheral regions 30, 32, 34, and 36.

As described below, the semiconductor chip CH-1 may have a bump density of bumps differently arranged in each region on the chip body 20 to increase adhesion reliability in an adhesive layer attaching process to be described below, and thus, the reliability of a semiconductor package may be increased.

Figure 4A:
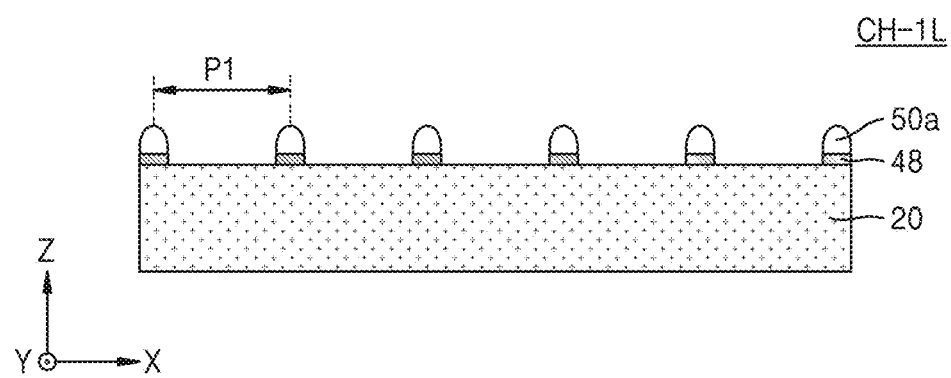
FIGS. 4A and 4B are cross-sectional views illustrating the bump density of the semiconductor chip of FIGS. 2 and 3.
Figure 4B:
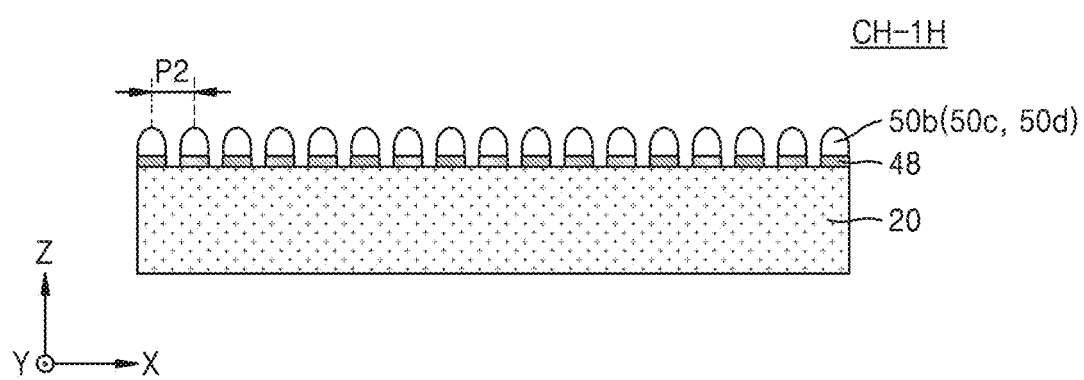
Figure 5A:
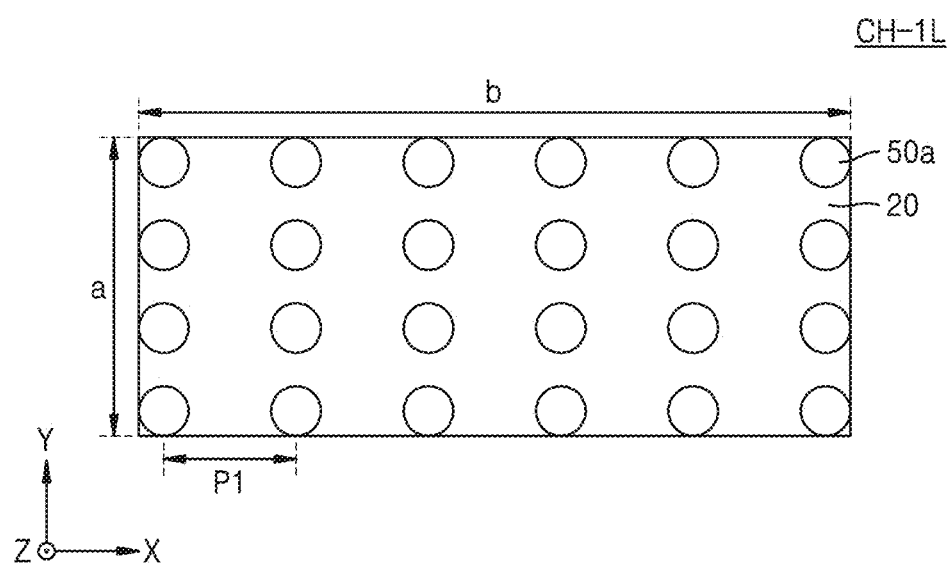
FIGS. 5A and 5B are plan views illustrating the bump density of the semiconductor chip of FIGS. 2 and 3.
Figure 5B:
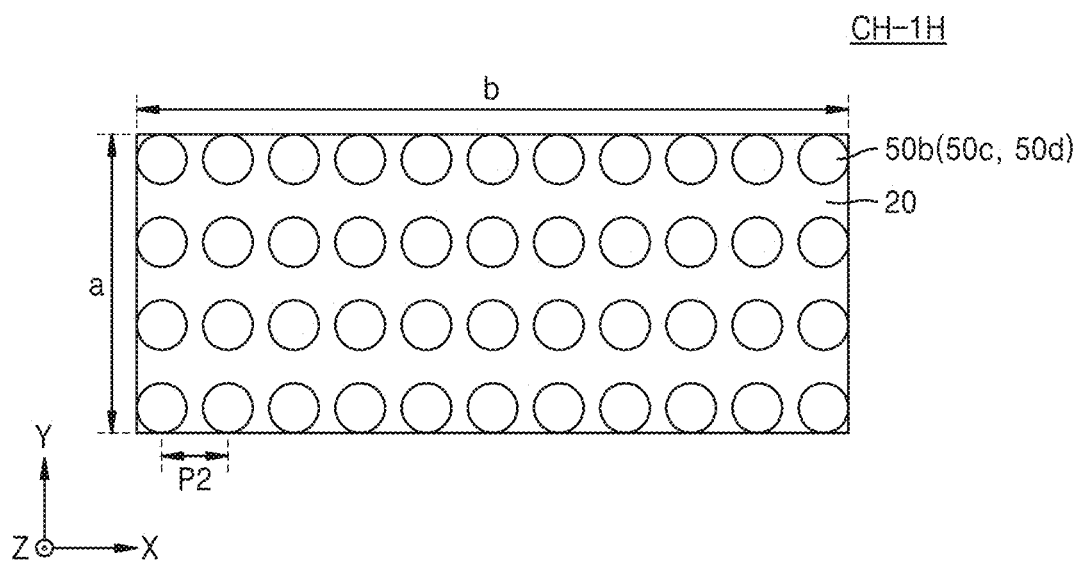
Figure 6A:
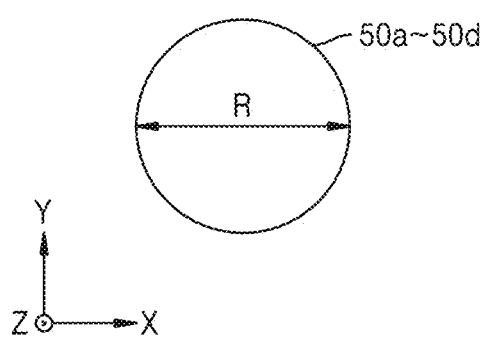
FIGS. 6A and 6B are plan views of bumps of the semiconductor chip of FIGS. 2 and 3.
Figure 6B:
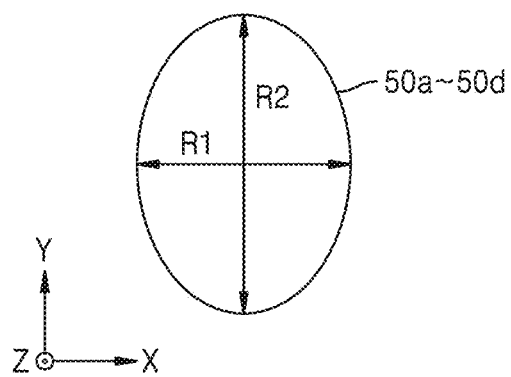

FIGS. 4A and 4B are cross-sectional views illustrating the bump density of the semiconductor chip of FIGS. 2 and 3, FIGS. 5A and 5B are plan views illustrating the bump density of the semiconductor chip of FIGS. 2 and 3, and FIG. 6A. and FIG. 6B are plan views of bumps of the semiconductor chip of FIGS. 2 and 3.

Specifically, in FIGS. 4A, 4B, 5A, 5B, 6A, and 6B, the same reference numerals as in FIGS. 2 and 3 denote the same members. In FIGS. 4A, 4B, 5A, 5B, 6A, and 6B, the same description as in FIGS. 2 and 3 is briefly given below or omitted for the sake of convenience.

The semiconductor chips CH-1 illustrated in FIGS. 2 and 3 may include a semiconductor chip CH-1L illustrated in FIGS. 4A and 5A, and a semiconductor chip CH-1H illustrated in FIGS. 4B and 5B. FIGS. 4A and 5A illustrate the semiconductor chip CH-1L in which a plurality of first bumps 50a of a first bump density, for example, a low bump density, are arranged on the chip body 20.

FIGS. 4B and 5B illustrate a semiconductor chip CH-1H in which a plurality of second to fourth bumps 50b, 50c, and 50d of a second bump density higher than the first bump density, for example, a high bump density, are arranged on the chip body 20.

The first to fourth bumps 50a, 50b, 50c, and 50d may include conductive materials. In some embodiments, the first to fourth bumps 50a, 50b, 50c, and 50d may include at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), and a metal alloy.

In FIGS. 4A and 4B, the first to fourth bumps 50a to 50d are illustrated to have semicircular cross-sections but may have circular, elliptical, square, or rectangular cross-sections. The first to fourth bumps 50a to 50d may include at least one of a spherical structure, a columnar structure, and a pillar-shaped structure.

In the present embodiment, some of the first bumps 50a, some of the second bumps 50b, some of the third bumps 50c, and some of the fourth bumps 50d may be dummy bumps but are not limited thereto. The dummy bumps have structures and shapes which are the same as or similar to actual bumps but exist only as a pattern without actual function in a semiconductor chip. Accordingly, no electrical signal may be applied to the dummy bumps, and the dummy bumps may be configured not to electrically perform a specific function.

The bump density in a certain region may be calculated by dividing areas of the first to fourth bumps 50a, 50b, 50c, and 50d by an area of the corresponding region. The region illustrated in FIG. 5A has a vertical length a and a horizontal length b, thereby having an area of a×b in the corresponding region. In FIG. 5A, when the total area of the first bumps 50a is divided by the area of the corresponding region (that is, the area of a×b), the first bump density, that is, the low bump density, may be calculated.

As illustrated in FIGS. 4A and 5A, the first bumps 50a may be arranged at equal intervals and may have a first distance (pitch) P1. The first distance P1 may be about 10 μm to about 1,000 μm.

A region illustrated in FIG. 5B has a vertical length a and a horizontal length b, thereby having an area of a×b in the corresponding region. In FIG. 5B, when the total area of the second to fourth bumps 50b, 50c, and 50d is divided by the area of the corresponding region (that is, the area of a×b), the second to fourth bump densities, that is, the low bump densities, may be calculated.

As illustrated in FIGS. 4B and 5B, the second to fourth bumps 50b, 50c, and 50d may be arranged at equal intervals and may have a second distance (pitch) P2 less than the first distance P1. The second distance P2 may be about 10 μm to about 1,000 μm.

As illustrated in FIGS. 6A and 6B, the first to fourth bumps 50a to 50d may have planar shapes of a circular shape and an elliptical shape. When the first to fourth bumps 50a to 50d have a circular shape, diameters thereof may be R. When the first to fourth bumps 50a to 50d have an elliptical shape, diameters thereof may be R1 and R2.

When the semiconductor chip CH-1 of FIGS. 2 and 3 has the second bump density of about 10% to about 20%, the first bump density may be greater than about 0% and less than a half of the second bump density. When the semiconductor chip CH-1 of FIGS. 2 and 3 has the second bump density of about 20% to about 60%, the first bump density may be greater than about 0% and less than about 20%.

In addition, the first unit regions 30a, 32a, 34a, and 36a may include a plurality of first bumps 50a of a first bump density, for example, a low bump density, on the chip body 20 as illustrated in FIGS. 4A and 5A. The first bumps 50a may be formed on a bump metal layer 48. The first bumps 50a may be spaced apart from each other. In some embodiments, the bump metal layer 48 may include any one selected from titanium (Ti), copper (Cu), and titanium tungsten (TiW).

The second unit regions 30b, 32b, 34b, and 36b of FIG. 3 may include a plurality of second bumps 50b of a second bump density higher than the first bump density, for example, a high bump density on the chip body 20 as illustrated in FIGS. 4B and 5B. The second bumps 50b may be formed on the bump metal layer 48. The second bumps 50b may be spaced apart from each other.

In addition, the central region 38 of FIG. 3 may include a plurality of third bumps 50c of a third bump density equal to the second bump density, for example, a high bump density on the chip body 20 as illustrated in FIGS. 4B and 5B.

The first to fourth corner regions 40, 42, 44, and 46 of FIG. 3 may include a plurality of fourth bumps 50d of a fourth bump density equal to the second bump density for example, a high bump density, on the chip body 20 as illustrated in FIGS. 4B and 5B.

The semiconductor chip CH-1 of FIGS. 2 and 3 has the third and fourth bumps 50c and 50d of the high bump density in the central region 38 and the first to fourth corner regions 40, 42, 44, and 46. The semiconductor chip CH-1 includes the first bumps 50a of the low bump density and the second bumps 50b of the high bump density in the first to fourth peripheral regions 30, 32, 34, and 36. As described below, the semiconductor chip CH-1 of FIGS. 2 and 3 may have a bump density of bumps differently arranged in each region on the chip body 20 to increase adhesion reliability in an adhesive layer attaching process to be described below, and thus, the reliability of a semiconductor package may be increased.

Figure 7:
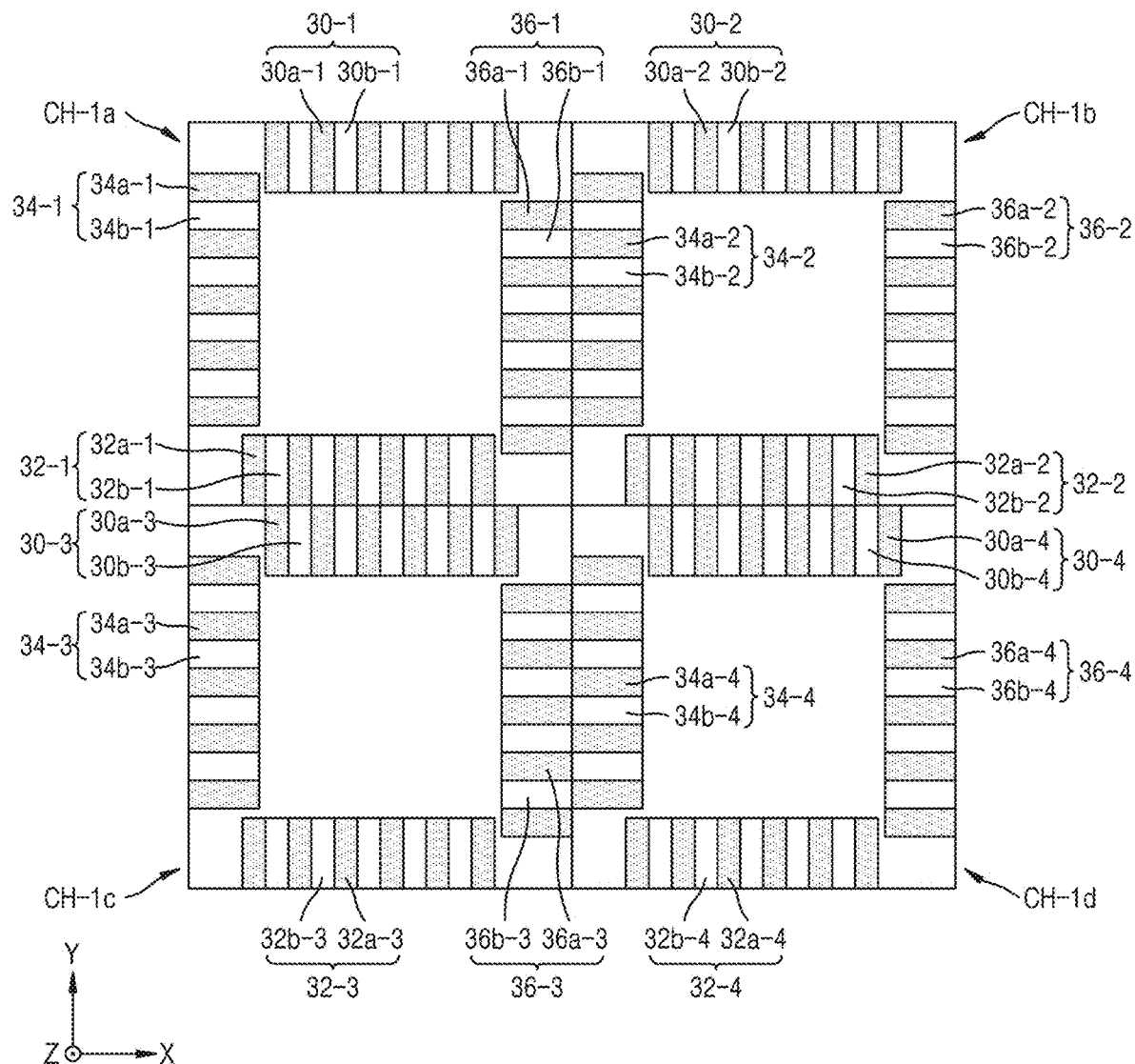
FIG. 7 is a plan view illustrating a semiconductor chip group according to an example embodiment of the inventive concepts.

FIG. 7 is a plan view illustrating a semiconductor chip group according to an example embodiment of the inventive concepts.

Specifically, a semiconductor chip group CH-1P may include four semiconductor chips CH-1a, CH-1b, CH-1c, and CH-1d. The semiconductor chip group CH-1P may include four semiconductor chips CH as indicated by the reference numeral AR2 of FIG. 1 described above.

The semiconductor chip group CH-1P may have a shape in which the four semiconductor chips CH-1 illustrated in FIG. 3 are combined. When the four semiconductor chips CH-1a, CH-1b, CH-1c, and CH-1d constituting the semiconductor chip group CH-1P are individualized, the semiconductor chip CH-1 of FIG. 3 may be obtained. In FIG. 7, the same or similar reference numerals as in FIG. 3 denote the same or similar members.

The first semiconductor chip CH-1a may include first to fourth peripheral regions 30-1, 32-1, 34-1, and 36-1. The first to fourth peripheral regions 30-1, 32-1, 34-1, and 36-1 may respectively include a plurality of first unit regions 30a-1, 32a-1 and 34a-1, and 36a-1, and second unit regions 30b-1, 32b-1, 34b-1, and 36b-1.

The second semiconductor chip CH-1b may include fifth to eighth peripheral regions 30-2, 32-2, 34-2, and 36-2. The fifth to eighth peripheral regions 30-2, 32-2, 34-2, and 36-2 respectively include a plurality of first unit regions 30a-2, 32a-2, 34a-2, and 36a-2 and second unit regions 30b-2, 32b-2, 34b-2, and 36b-2.

The fourth peripheral region 36-1 of the first semiconductor chip CH1-1a may be in contact with the seventh peripheral region 34-2 of the second semiconductor chip CH-1b. The first unit region 36a-1 of the fourth peripheral region 36-1 may be not in contact with the first unit regions 34a-2 of the seventh peripheral region 34-2, and but may be in contact with the second unit regions 34b-2.

The first unit regions 30a-1, 32a-1, 34a-1, 36a-1, 30a-2, 32a-2, 34a-2, and 36a-2 may include a plurality of first bumps of a first bump density, for example, a low bump density. The second unit regions 30b-1, 32b-1, 34b-1, 36b-1, 30b-2, 32b-2, 34b-2, and 36b-2 may include a plurality of second bumps of a second bump density higher than the first bump density, for example, a high bump density.

The third semiconductor chip CH-1c may include ninth to twelfth peripheral regions 30-3, 32-3, 34-3, and 36-3. The ninth to twelfth peripheral regions 30-3, 32-3, 34-3, and 36-3 may respectively include a plurality of first unit regions 30a-3, 32a-3, and 34a-3, and 36a-3 and second unit regions 30b-3, 32b-3, 34b-3, and 36b-3.

The fourth semiconductor chip CH-1d may include thirteenth to sixteenth peripheral regions 30-4, 32-4, 34-4 and 36-4. The thirteenth to sixteenth peripheral regions 30-4, 32-4, 34-4, and 36-4 may respectively include a plurality of first unit regions 30a-4, 32a-4, 34a-4, and 36a-4 and second unit regions 30b-4, 32b-4, 34b-4, and 36b-4.

The fourth peripheral region 36-1 of the first semiconductor chip CH1-1a may be in contact with the seventh peripheral region 34-2 of the second semiconductor chip CH-1b. The first unit regions 36a-1 of the fourth peripheral region 36-1 may be not in contact with the first unit regions 34a-2 of the seventh peripheral region 34-2 and may be in contact with the second unit regions 34b-2.

The sixth peripheral region 32-2 of the second semiconductor chip CH1-1b may be in contact with the fifteenth peripheral region 30-4 of the fourth semiconductor chip CH-1d. The first unit regions 32a-2 of the sixth peripheral region 32-2 may be not in contact with the first unit regions 30a-4 of the fifteenth peripheral region 30-4 and may be in contact with the second unit regions 30b-4.

The second peripheral region 32-1 of the first semiconductor chip CH1-1a may be in contact with the ninth peripheral region 30-3 of the fourth semiconductor chip CH-1d. The first unit regions 32a-1 of the second peripheral region 32-1 may be not in contact with the first unit regions 30a-3 of the ninth peripheral region 30-3 and may be in contact with the second unit regions 30b-3.

The twelfth peripheral region 36-3 of the third semiconductor chip CH1-1c may be in contact with the fifteenth peripheral region 34-4 of the fourth semiconductor chip CH-1d. The first unit regions 36a-3 of the fourth peripheral region 36-3 may be not in contact with the first unit regions 34a-4 of the fifteenth peripheral region 34-4 and may be in contact with the second unit regions 34b-4.

Accordingly, the sixth peripheral region 32-2 of the second semiconductor chip CH1-1b and the fifteenth peripheral region 30-4 of the fourth semiconductor chip CH-1d, the second peripheral region 32-1 of the first semiconductor chip CH1-1a and the ninth peripheral region 30-3 of the fourth semiconductor chip CH-1d, and the twelfth peripheral region 36-3 of the third semiconductor chip CH1-1c and the fifteenth peripheral region 34-4 of the fourth semiconductor chip CH-1d may have all bumps of a low bump density and a high bump density, and thus, bump density may be adjusted in an adhesive layer attaching process to increase the reliability of an adhesion process.

Figure 8A:
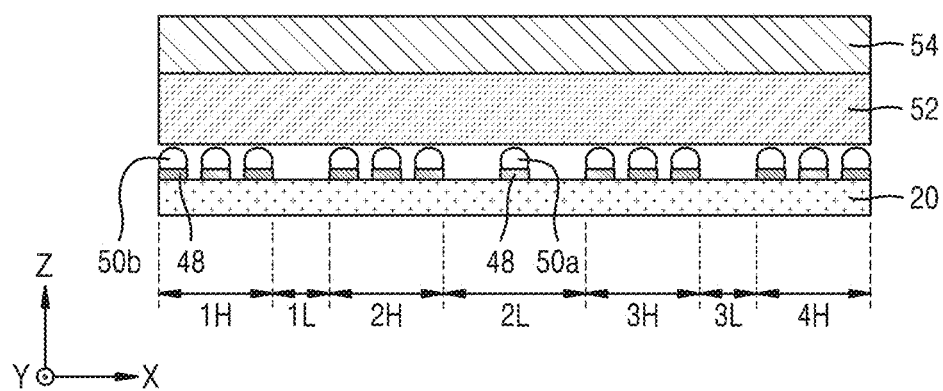
FIGS. 8A to 8C are cross-sectional views illustrating a method of manufacturing semiconductor chips according to an example embodiment of the inventive concepts.
Figure 8B:
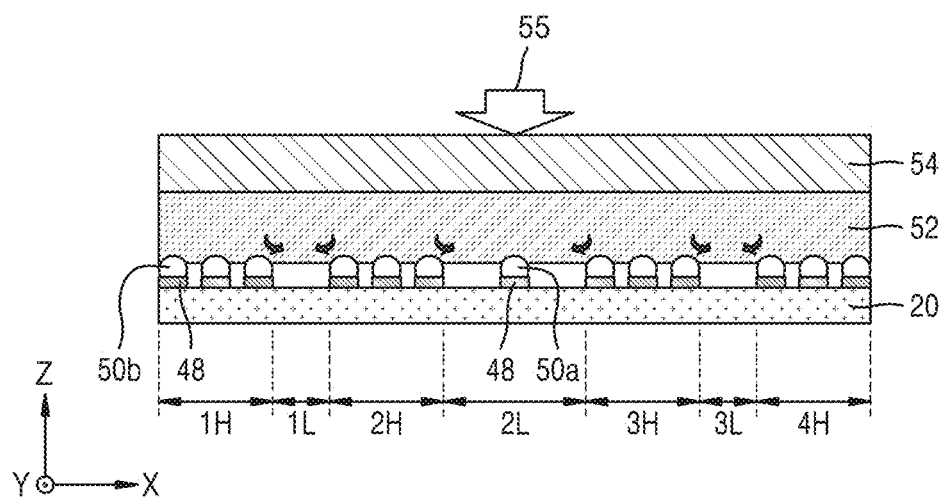
Figure 8C:
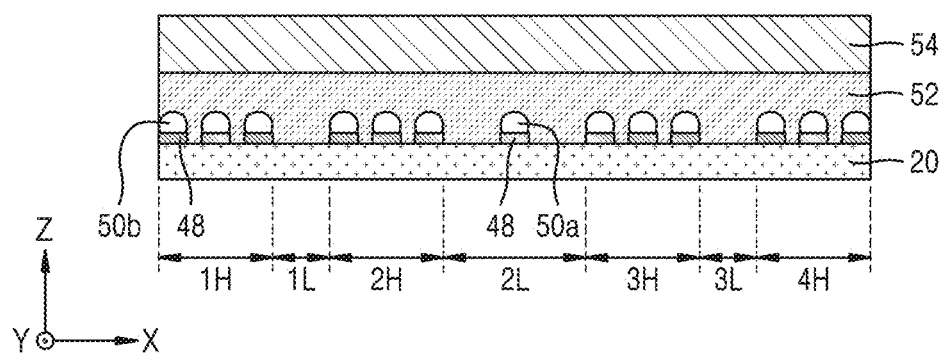

FIGS. 8A to 8C are cross-sectional views illustrating a method of manufacturing semiconductor chips, according to an example embodiment of the inventive concepts.

Specifically, in FIGS. 8A to 8C, the same reference numerals as in FIGS. 3, 4A, 4B, 5A, and 5B denote the same members. FIGS. 8A to 8C illustrate an attachment process of attaching an adhesive layer 52 on the first bumps 50a and the second bumps 50b, in a horizontal direction of any one of the first to fourth peripheral regions 30, 32, 34, and 36 of FIG. 3, for example, in a horizontal direction of the first peripheral region 30, that is, in the X-direction.

As illustrated in FIG. 8A, the chip body 20 may include low bump density regions 1L, 2L, and 3L including the first bumps 50a of a first bump density, for example, a low bump density, and high bump density regions 1H, 2H, 3H, and 4H including the second bumps 50b of a second bump density higher than the bump density, for example, a high bump density.

The first bumps 50a and the second bumps 50b may be attached onto the bump metal layer 48. The low bump density regions 1L, 2L, and 3L may correspond to the first unit regions 30a of FIG. 3, and the high bump density regions 1H, 2H, 3H, and 4H may correspond to the second unit regions 30b of FIG. 3. The adhesive layer 52 and a carrier substrate 54 may be mounted on the high bump density regions 1H, 2H, 3H, and 4H and the low bump density regions 1L, 2L, and 3L.

The adhesive layer 52 may include a non-conductive film (NCF) or a non-conductive paste (NCP). The adhesive layer 52 may include a resin such as acrylic or epoxy. The carrier substrate 54 may include a silicon substrate, a ceramic substrate, or a polymer substrate.

As illustrated in FIG. 8B, the adhesive layer 52 mounted on the high bump density regions 1H, 2H, 3H, and 4H and the low bump density regions 1L, 2L, and 3L may be attached to the carrier substrate 54 by applying heat and pressure 55 thereto. During thermocompression attachment of the adhesive layer 52, the adhesive layer 52 may be uniformly spread onto the chip body 20 as indicated by an arrow because the high bump density regions 1H, 2H, 3H, and 4H and the low bump density regions 1L, 2L, and 3L are dispersedly arranged on the chip body 20.

Then, the adhesive layer 52 may be uniformly attached between the first bumps 50a and the second bumps 50b on the low bump density regions 1L, 2L, and 3L and the high bump density regions 1H, 2H, 3H, and 4H of the chip body 20 as illustrated in FIG. 8C.

In other words, voids may not be generated in the adhesive layer 52 between the first bumps 50a and the second bumps 50b on the low bump density regions 1L, 2L, and 3L and the high bump density regions 1H, 2H, 3H, and 4H. As a result, the semiconductor chip CH-1 of FIG. 3 according to the inventive concepts may increase the reliability of an adhesive layer attachment process by adjusting density of the first and second bumps 50a and 50b.

Figure 9:
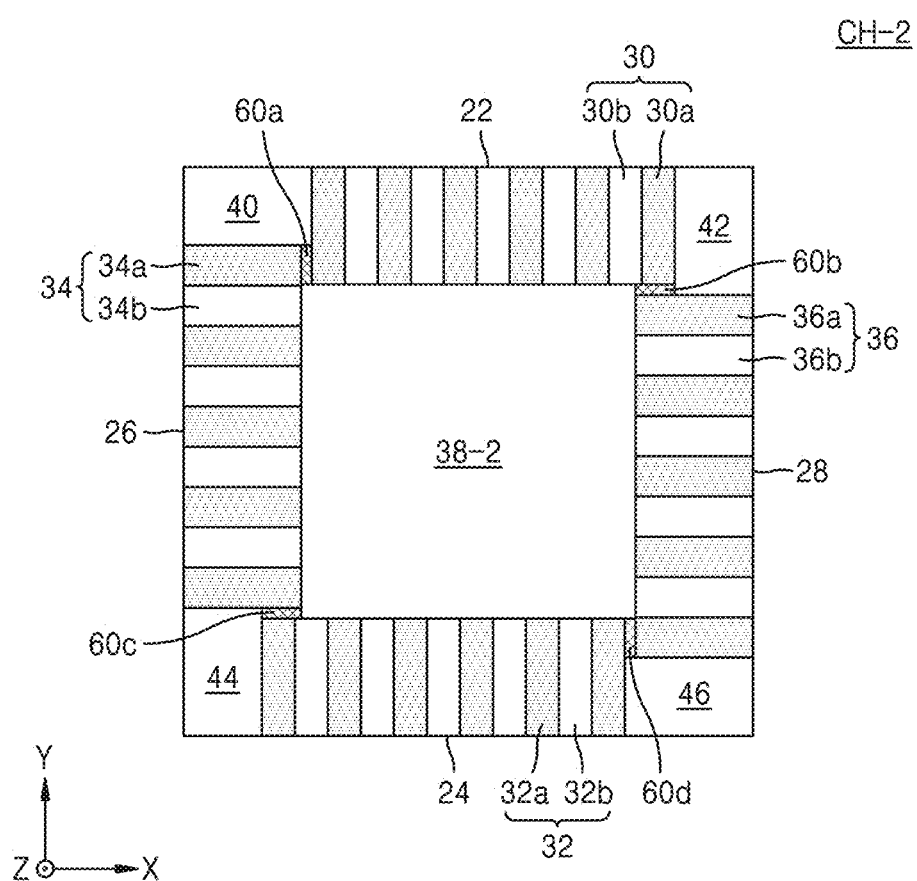
FIG. 9 is a view illustrating the bump density of bumps differently arranged in each region of a semiconductor chip according to an embodiment of the inventive concepts.

FIG. 9 is a view illustrating the bump density of bumps differently arranged in each region of a semiconductor chip according to an embodiment of the inventive concepts.

Specifically, a semiconductor chip CH-2 may be different from the semiconductor chip illustrated in FIGS. 2 and 3 in that the semiconductor chip CH-2 further includes peripheral connection regions 60a, 60b, 60c, and 60d connecting the peripheral regions 30, 32, 34, and 36 to each other In FIG. 9, the same reference numerals as in FIG. 3 denote the same members. In FIG. 9, the same description as in FIG. 3 is briefly given below or omitted for the sake of convenience.

The semiconductor chip CH-2 may include a central region 38-2, first to fourth peripheral connection regions 60a, 60b, 60c, and 60d arranged around the central region 38-2, and corner regions 40, 42, 44, and 46 on the chip body 20. The first to fourth peripheral connection regions 60a, 60b, 60c, and 60d may include a plurality of first bumps of a first bump density, for example, a low bump density. The central region 38-2 and the corner regions 40, 42, 44, and 46 may be separated by the first to fourth peripheral connection regions 60a, 60b, 60c, and 60d.

The first peripheral connection region 60a may connect the first peripheral region 30 to the third peripheral region 34. The first peripheral connection region 60a may connect the first unit regions 30a and 34a to each other. The second peripheral connection region 60b may connect the first peripheral region 30 to the fourth peripheral region 36. The second peripheral connection region 60b may connect the first unit regions 30a and 36a to each other.

The third peripheral connection region 60c may connect the second peripheral region 32 to the third peripheral region 34. The third peripheral connection region 60c may connect the first unit regions 34a and 32a to each other. The fourth peripheral connection region 60d may connect the second peripheral region 32 to the fourth peripheral region 36. The fourth peripheral connection region 60d may connect the first unit regions 32a and 36a to each other. The semiconductor chip CH-2 described above may accurately control bump density of the first to fourth peripheral regions 30, 32, 34, and 36 by further including the first to fourth peripheral connection regions 60a, 60b, 60c, and 60d.

Figure 10:
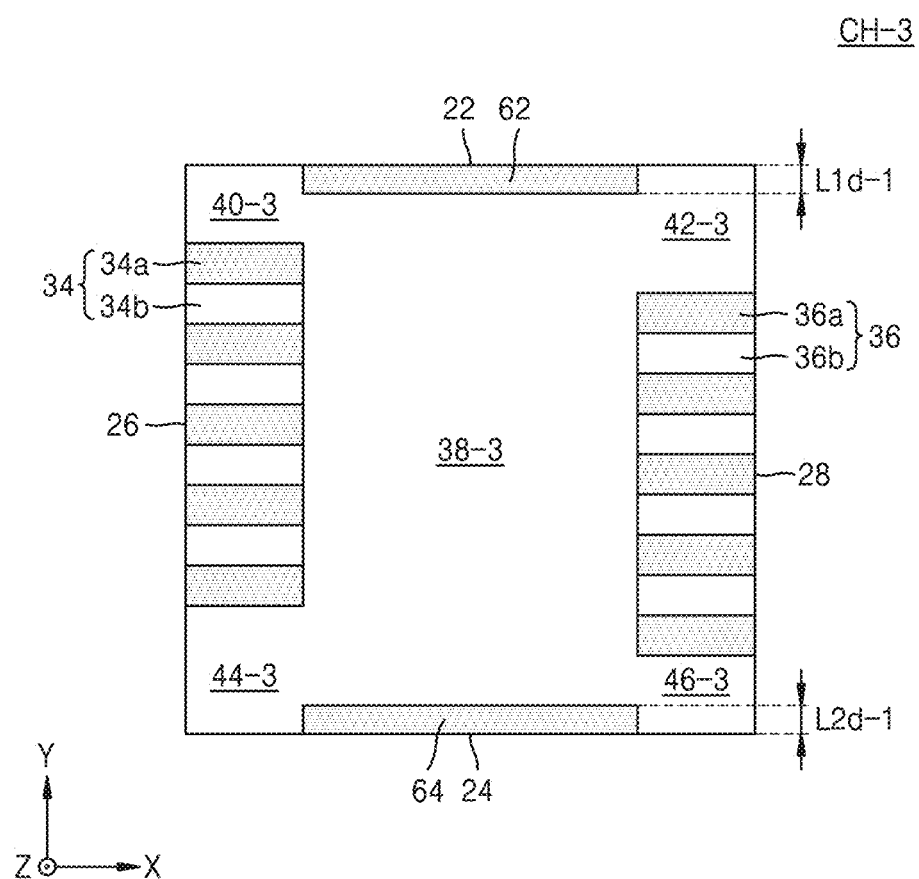
FIG. 10 is a diagram illustrating the bump density of bumps differently arranged in each region of a semiconductor chip according to an embodiment of the inventive concepts.

FIG. 10 is a diagram illustrating the bump density of bumps differently arranged in each region of a semiconductor chip according to an embodiment of the inventive concepts.

Specifically, a semiconductor chip CH-3 may be different from the semiconductor chip illustrated in FIG. 3 in that the semiconductor chip CH-3 includes the third and fourth peripheral regions 34 and 36, first and second peripheral regions 62 and 64 respectively have short first and second peripheral vertical lengths L1d-1 and L2d-1, and the first and second peripheral regions 62 and 64 include first bumps of a first bump density, for example, a low bump density.

In FIG. 10, the same reference numerals as in FIG. 3 denote the same members. In FIG. 10, the same description as in FIG. 3 is briefly given below or omitted for the sake of convenience. The semiconductor chip CH-3 may include a central region 38-3, the first and second peripheral regions 62 and 64 arranged around the central region 38-3, third and fourth peripheral regions 34 and 36, and first to fourth corner regions 40-3, 42-3, 44-3, and 46-3 on the chip body 20.

The first and second peripheral regions 62 and 64 may be located in portions adjacent to the first and second side surfaces 22 and 24. The first and second peripheral regions 62 and 64 may respectively have the short first and second peripheral vertical lengths L1d-1 and L2d-1.

For example, the first and second peripheral regions 62 and 64 may have peripheral vertical lengths less than the first and second peripheral vertical lengths L1d and L2d of FIG. 3. The first and second peripheral regions 62 and 64 may include first bumps of a first bump density, for example, a low bump density.

The third and fourth peripheral regions 34 and 36 may be respectively located at portions adjacent to the third and fourth side surfaces 26 and 28. The third and fourth peripheral regions 34 and 36 may respectively include a plurality of first unit regions 34a and 36a and a plurality of second unit regions 34b and 36b The first unit regions 34a and 36a may include a plurality of first bumps of a first bump density, for example, a low bump density. The second unit regions 34b and 36b may include a plurality of second bumps of a second bump density higher than the first bump density, for example, a high bump density. The central region 38-3 may communicate with the first to fourth corner regions 40-3, 42-3, 44-3, and 46-3.

The semiconductor chip CH-3 described above includes the first and second peripheral regions 62 and 64 having short first and second peripheral vertical lengths L1d-1 and L2d-1, and thus, the first to fourth peripheral regions 62, 64, 34, and 36 may be arranged in various bump densities.

Figure 11:
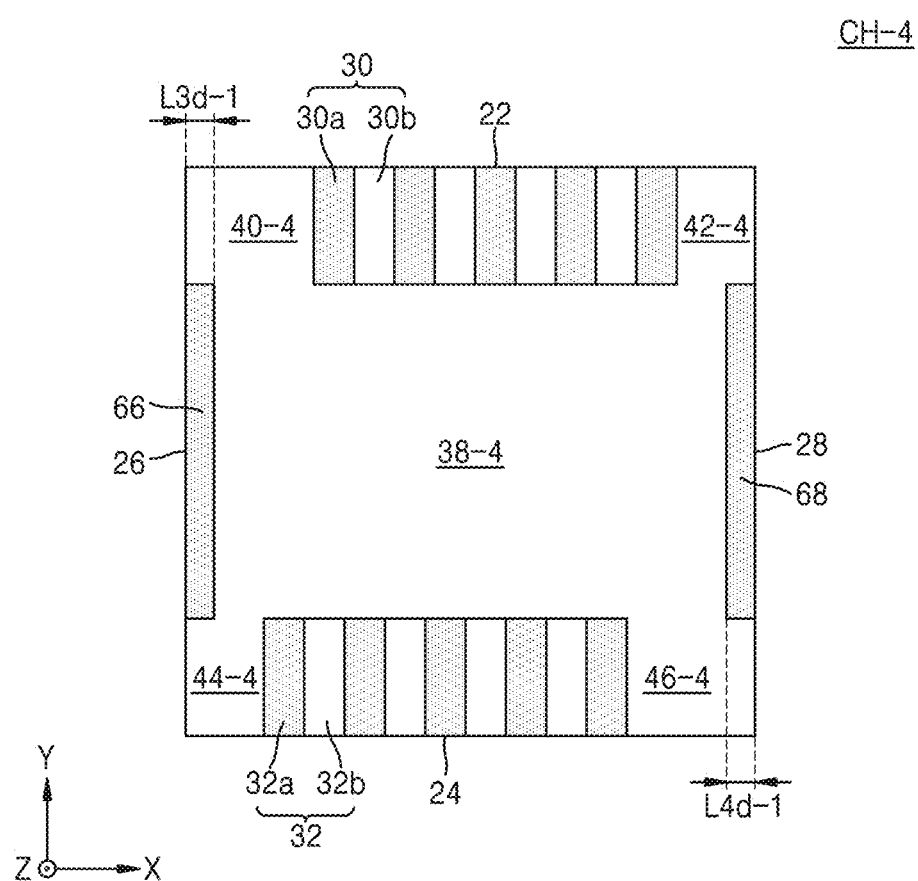
FIG. 11 is a view illustrating the bump density of bumps differently arranged in each region of a semiconductor chip according to an embodiment of the inventive concepts.

FIG. 11 is a view illustrating the bump density of bumps differently arranged in each region of a semiconductor chip according to an embodiment of the inventive concepts.

Specifically, a semiconductor chip CH-4 may be different from the semiconductor chip illustrated in FIG. 3 in that the semiconductor chip CH-4 includes the first and second peripheral regions 30 and 32, the third and fourth peripheral regions 66 and 68 respectively have short first and second peripheral horizontal lengths L3d-1 and L4d-1, and the third and fourth peripheral regions 66 and 68 include first bumps of a first bump density, for example, a low bump density.

In FIG. 11, the same reference numerals as in FIG. 3 denote the same members. In FIG. 11, the same description as in FIG. 3 is briefly given below or omitted for the sake of convenience. The semiconductor chip CH-4 may include a central region 38-4, first and second peripheral regions 30 and 32 arranged around the central region 38-4, third and fourth peripheral regions 66 and 68, first to fourth corner regions 40-4, 42-4, 44-4, and 46-4 on the chip body 20.

The first and second peripheral regions 30 and 32 may be located in portions adjacent to the first and second side surfaces 22 and 24. The first and second peripheral regions 30 and 32 may respectively include a plurality of first unit regions 30a and 32a and second unit regions 30b and 32b.

The first unit regions 30a and 32a may include a plurality of first bumps of a first bump density, for example, a low bump density. The second unit regions 30b and 32b may include a plurality of second bumps of a second bump density higher than the first bump density, for example, a high bump density.

The third and fourth peripheral regions 66 and 68 may be located in portions adjacent to third and fourth sides 26 and 28. The third and fourth peripheral regions 66 and 68 may respectively have short first and second peripheral horizontal lengths L3d-1 and L4d-1. For example, the third and fourth peripheral regions 66 and 68 may have peripheral horizontal lengths less than the first and second peripheral horizontal lengths L3d-1 and L4d-1 of FIG. 3. The third and fourth peripheral regions 66 and 68 may include first bumps of a first bump density, for example, a low bump density. The central region 38-4 may communicate with the first to fourth corner regions 40-4, 42-4, 44-4, and 46-4.

The semiconductor chip CH-4 described above includes the third and fourth peripheral regions 66 and 68 having short first and second peripheral horizontal lengths L3d-1 and L4d-1, and thus, the first to fourth peripheral regions 30, 32, 66, and 68 may be arranged in various bump densities.

Figure 12:
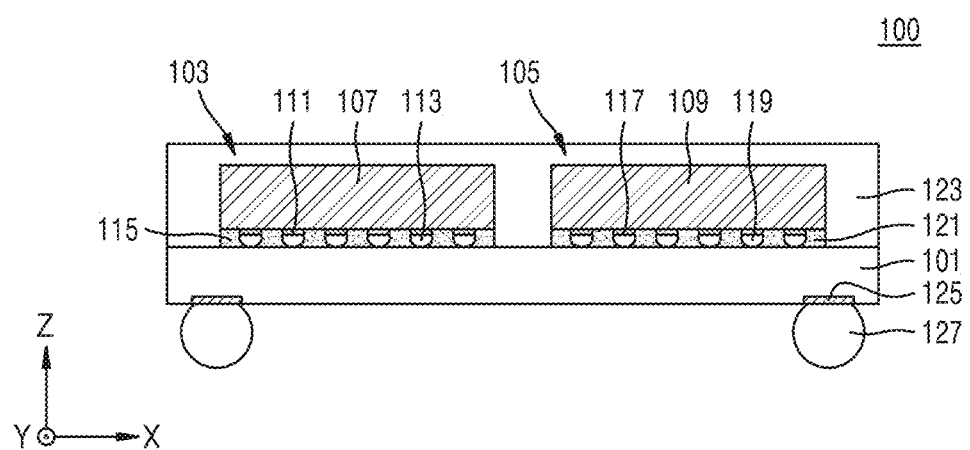
FIG. 12 is a cross-sectional view illustrating a semiconductor package including semiconductor chips, according to an embodiment of the inventive concepts.

FIG. 12 is a cross-sectional view illustrating a semiconductor package including a semiconductor chip, according to an embodiment of the inventive concepts.

Specifically, a semiconductor package 100 may include a package substrate 101 and first and second semiconductor chips 103 and 105 arranged horizontally, that is, separated from each other in the X direction, on the package substrate 101.

The package substrate 101 may be a printed circuit board (PCB) and may have a single-layer structure or a multi-layer structure. The package substrate 101 may include an insulating core layer including at least one of a prepreg resin, a thermosetting epoxy resin, a thermoplastic epoxy resin, and a resin including a filler, and conductive wiring patterns formed on and beneath the core layer.

Although the first and second semiconductor chips 103 and 105 are horizontally separated from each other in the present embodiment, the first and second semiconductor chips 103 and 105 may be vertically stacked in the Z direction. The first and second semiconductor chips 103 and 105 may correspond to the semiconductor chips CH-1 to CH-4 described above according to an embodiment of the inventive concepts.

The first semiconductor chip 103 may include a first chip body 107. First bump metal layers 111 and first bumps 113 may be on one surface of the first chip body 107. The first bump metal layers 111 and the first bumps 113 may be electrically connected to the package substrate 101.

A first adhesive layer 115 may be between the first bump metal layers 111 and the first bumps 113 to adhere to the package substrate 101. As described above, voids may not be generated in the first adhesive layer 115 by adjusting the bump density of the first bumps 113.

The second semiconductor chip 105 may include a second chip body 109. Second bump metal layers 117 and second bumps 119 may be on one surface of the second chip body 109. The second bump metal layers 117 and the second bumps 119 may be electrically connected to the package substrate 101.

A second adhesive layer 121 may be between the second bump metal layers 117 and the second bumps 119 to adhere to the package substrate 101. As described above, voids may not be generated in the second adhesive layer 121 by adjusting the bump density of the second bumps 119.

The semiconductor package 100 may include a molding layer 123 covering the first and second semiconductor chips 103 and 105 attached on the package substrate 101. The molding layer 123 may be formed of, for example, a silicone-based material, a thermosetting material, a thermoplastic material, an ultraviolet (UV)-treated material, or so on. The molding layer 123 may be formed of a polymer such as a resin and may be formed of, for example, an epoxy molding compound (EMC).

In addition, the semiconductor package 100 may have connection pads 125 and connection terminals 127 attached to a lower portion of the package substrate 101. The connection terminals 127 may include solder bumps or solder balls.

Figure 13:
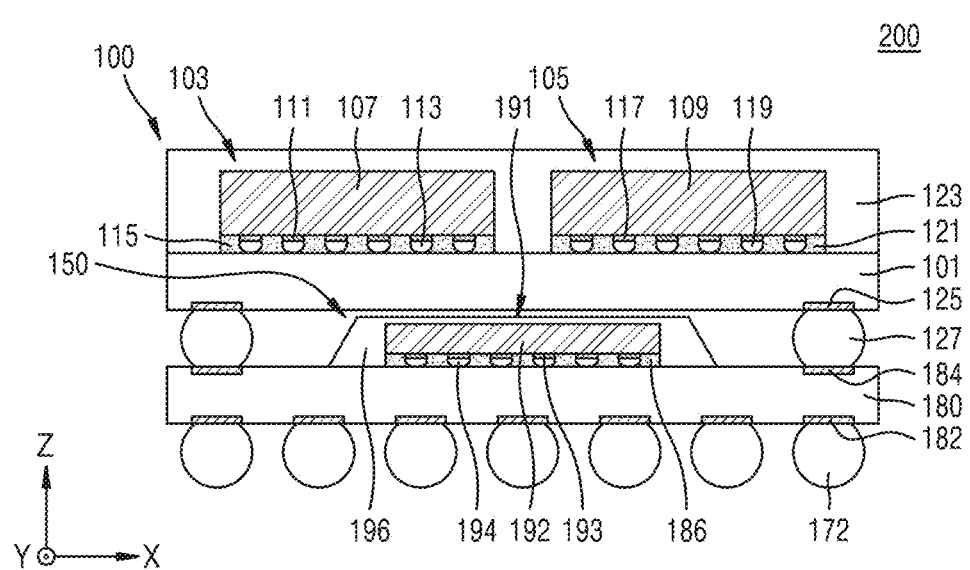
FIG. 13 is a cross-sectional view illustrating a semiconductor package including semiconductor chips, according to an example embodiment of the inventive concepts.

FIG. 13 is a cross-sectional view illustrating a semiconductor package including a semiconductor chip, according to an example embodiment of the inventive concepts.

Specifically, a semiconductor package 200 may have a package-on-package structure in which the second semiconductor package 100 is mounted on a first semiconductor package 150. The second semiconductor package 100 is previously described above with reference to FIG. 12, and thus, detailed descriptions thereof are omitted.

The first semiconductor package 150 may include a third semiconductor chip 191 attached onto a lower package substrate 180. The third semiconductor chip 191 may correspond to the semiconductor chips CH-1 to CH-4 described above according to an embodiment of the inventive concepts.

The third semiconductor chip 191 may include a third chip body 192. Third bump metal layers 193 and third bumps 194 may be on one surface of the third chip body 192. The third bump metal layers 193 and the third bumps 194 may be electrically connected to the lower package substrate 180.

A third adhesive layer 186 may be between the third bump metal layers 193 and the third bumps 194 to adhere to the lower package substrate 180. As described above, voids may not be generated in the third adhesive layer 186 by adjusting the bump density of the third bumps 194.

The first semiconductor package 150 may include a lower molding layer 196 covering the third semiconductor chip 191 attached onto the lower package substrate 180. In addition, upper and lower connection pads 184 and 182 may be respectively on upper and lower portions of the lower package substrate 180, lower connection terminals 172 are on the lower connection pads 182, and upper connection terminals 127 are on the upper connection pads 184. The lower connection terminals 172 may include solder bumps or solder balls.

Figure 14:
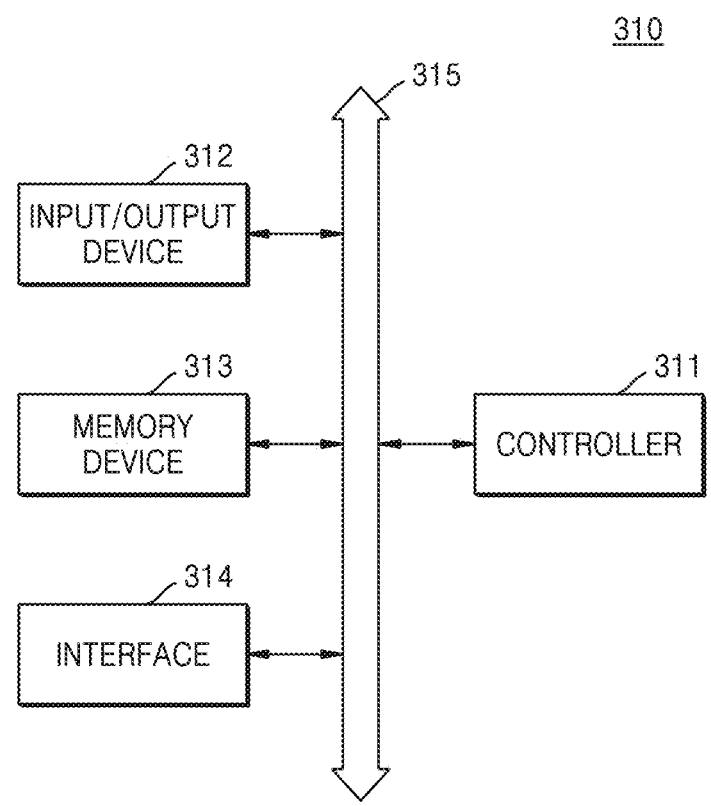
FIG. 14 is a schematic block diagram illustrating an example of a memory system including a semiconductor package including a semiconductor chip, according to an embodiment of the inventive concepts.

FIG. 14 is a schematic block diagram illustrating an example of a memory system including a semiconductor package including a semiconductor chip, according to an embodiment of the inventive concepts.

Specifically, a memory system 310 may be applied to a personal digital assistant (PDA), a portable computer, a web tablet, a wireless phone, a mobile phone, a digital music player, a memory card, or any device capable of transmitting and/or receiving information in a wireless environment.

The memory system 310 may include a controller 311, an input/output (I/O) device 312 such as a keypad, a keyboard, and a display device, a memory device 313 (or a memory chip), an interface 314, and a bus 315. The memory device 313 and the interface 314 communicate with each other via the bus 315.

The controller 311 may include at least one microprocessor, a digital signal processor, a microcontroller, or other processing devices similar thereto. The memory device 313 may store commands executed by the controller 311. The input/output device 312 may receive data or signals from the outside of the system 310 or output data or signals to the outside of the system 310. For example, the input/output device 312 may include a keyboard, a keypad, or a display device.

The memory device 313 and the controller 311 may include a semiconductor package including the semiconductor chips CH-1 to CH-4 according to the embodiment of the inventive concepts. The memory device 313 may further include another type of memory device, a volatile memory device that may be accessed at any time, or other various types of memory devices. The interface 314 may transmit data to or receive data from a communication network.

Figure 15:
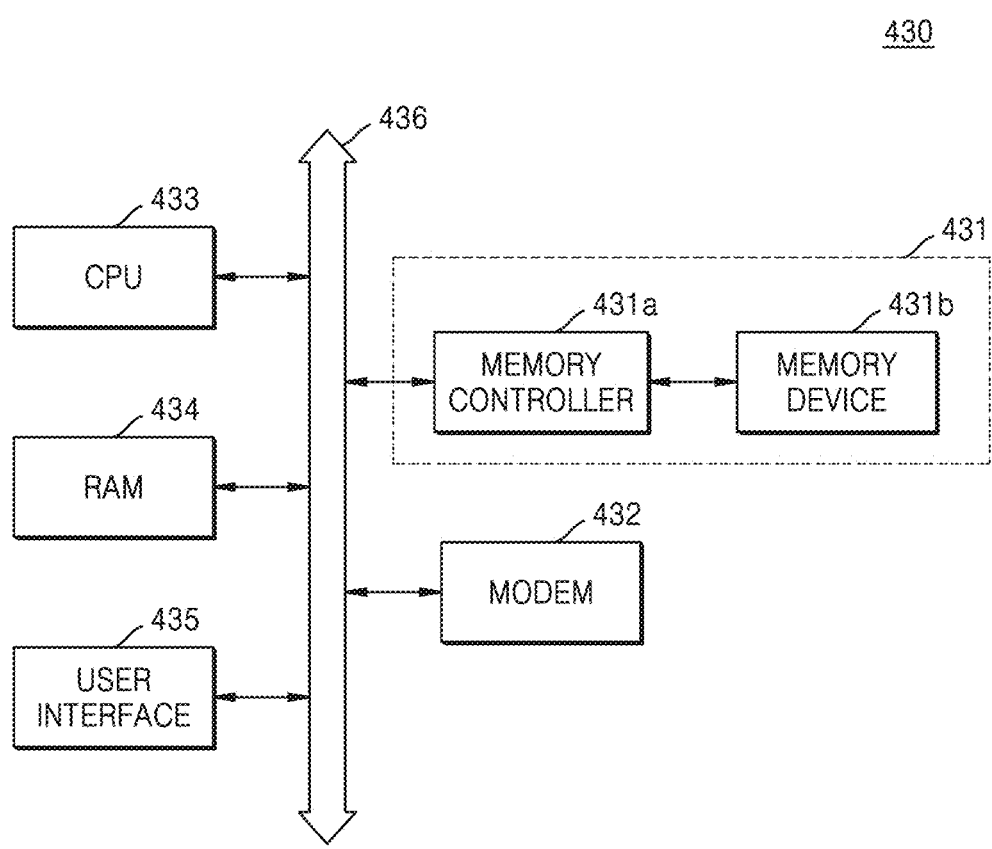
FIG. 15 is a schematic block diagram illustrating an example of an information processing system including a semiconductor package including a semiconductor chip, according to an embodiment of the inventive concepts.

FIG. 15 is a schematic block diagram illustrating an example of an information processing system including a semiconductor package including a semiconductor chip, according to an embodiment of the inventive concepts.

Specifically, an information processing system 430 may be used in a mobile device or a desktop computer. The information processing system 430 may include a memory system 431 including a memory controller 431a and a memory device 431b (or a memory chip).

The information processing system 430 may include a modulator/demodulator (MODEM) 432 electrically connected to a system bus 436, a central processing unit 433, random access memory (RAM) 434, and a user interface 435. Data processed by the central processing unit 433 or data input from the outside is stored in the memory system 431.

The memory system 431 including the memory controller 431a and the memory device 431b, the MODEM 432, the central processing unit 433, and the RAM 434 may include a semiconductor package including the semiconductor chips CH-1 to CH-4 according to the embodiment of the inventive concepts.

The memory system 431 may include a solid state drive, and in this case, the information processing system 430 may stably store a large amount of data in the memory system 431. In addition, as reliability increases, the memory system 431 may reduce resources required for error correction, thereby providing a high-speed data exchange function to the information processing system 430. It is apparent to those skilled in the art that the information processing system 430 may further include an application chipset, a camera image signal processor (ISP), an input/output device, and so on, which are not illustrated.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the inventive concepts have been particularly shown and described with reference to embodiments thereof, it will be understood that various changes in form and details may be made therein without departing from the spirit and scope of the following claims.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

What is claimed is:

1. A semiconductor chip comprising:
   a chip body that has a first side surface, a second side surface opposite the first side surface, a third side surface extending between the first side surface and the second side surface, and a fourth side surface extending between the first side surface and the second side surface and opposite the third side surface;
   a central region at a central portion of the chip body; and
   a first peripheral region at a first peripheral portion of the chip body and a third peripheral region at a third peripheral portion of the chip body and adjacent the first peripheral region, the first peripheral region being adjacent to the first side surface and the third peripheral region being adjacent to the third side surface, wherein
      the first peripheral region and the third peripheral region each include a first unit region that includes a plurality of first bumps of a first bump density, and a second unit region that includes a plurality of second bumps of a second bump density higher than the first bump density, and
      the first unit region and the second unit region of each of the first peripheral region and the third peripheral region are adjacent each other along the respective first side surface and third side surface.

2. The semiconductor chip of claim 1, further comprising:
   a second peripheral region adjacent to the second side surface.

3. The semiconductor chip of claim 2, wherein the first peripheral region is laterally offset relative to the second peripheral region.

4. The semiconductor chip of claim 1, further comprising:
   a fourth peripheral region adjacent to the fourth side surface.

5. The semiconductor chip of claim 4, wherein the third peripheral region is laterally offset relative to the fourth peripheral region.

6. The semiconductor chip of claim 1, wherein the second bump density of the second unit region is about 10% to about 20%, and the first bump density of the first unit region is greater than 0% and less than a half of the second bump density.

7. The semiconductor chip according to claim 1, wherein the second bump density of the second unit region is about 20% to about 60%, and the first bump density of the first unit region is greater than 0% and less than about 20%.

8. The semiconductor chip of claim 1, wherein the central region comprises a plurality of third bumps of a third bump density equal to the second bump density.

9. The semiconductor chip of claim 1, further comprising:
   a corner region adjacent to at least one of corners of the chip body,
      wherein the corner region has a fourth bump density equal to the second bump density.

10. A semiconductor chip comprising:
    a chip body that has a first side surface, a second side surface opposite the first side surface, a third side surface extending between the first side surface and the second side surface, and a fourth side surface extending between the first side surface and the second side surface and opposite the third side surface;
a central region at a central portion of the chip body; and
a peripheral region at a peripheral portion of the chip body and adjacent to at least one of the first side surface to the fourth side surface,
wherein the peripheral region comprises a plurality of first unit regions that include a plurality of first bumps of a first bump density, and a plurality of second unit regions that include a plurality of second bumps of a second bump density higher than the first bump density, and
wherein the plurality of first unit regions and the plurality of second unit regions are sequentially and repeatedly arranged along at least one of the first side surface to the fourth side surface.

11. The semiconductor chip of claim 10, wherein the peripheral region comprises a first peripheral region and a second peripheral region respectively adjacent to the first side surface and the second side surface,
wherein the plurality of first unit regions and the plurality of second unit regions of the first peripheral region respectively constitute first and second sub-regions,
wherein the plurality of first unit regions and the plurality of second unit regions of the second peripheral region respectively constitute third and fourth sub-regions, and
wherein the first and second sub-regions are laterally offset relative to the third and fourth sub-regions.

12. The semiconductor chip of claim 11, wherein the peripheral region comprises third and fourth peripheral regions respectively adjacent to the third side surface and the fourth side surface,
wherein the plurality of first unit regions and the plurality of second unit regions of the third peripheral region respectively constitute fifth and sixth sub-regions,
wherein the plurality of first unit regions and the plurality of second unit regions of the fourth peripheral region respectively constitute seventh and eighth sub-regions, and
wherein the fifth and sixth sub-regions are laterally offset relative to the seventh and eighth sub-regions.

13. The semiconductor chip of claim 10, wherein the plurality of first bumps are at equal intervals and have a first distance therebetween,
wherein the plurality of second bumps are at equal intervals and have a second distance therebetween, and
wherein the second distance is less than the first distance.

14. The semiconductor chip of claim 10, wherein the central region comprises a plurality of third bumps of a third bump density equal to the second bump density.

15. The semiconductor chip of claim 10, wherein the second bump density of each second unit region of the plurality of second unit regions is about 10% to about 20%, and the first bump density of each first unit region of the plurality of first unit regions is greater than 0% and less than a half of the second bump density.

16. The semiconductor chip of claim 10, wherein the second bump density of each second unit region of the plurality of second unit regions is about 20% to about 60%, and the first bump density of each first unit region of the plurality of first unit regions is greater than 0% and less than about 20%.

17. A semiconductor chip comprising:
a chip body that has a first side surface, a second side surface opposite the first side surface, a third side surface extending between the first side surface and the second side surface, and a fourth side surface extending between the first side surface and the second side surface and opposite the third side surface;
a central region at a central portion of the chip body; and
a first peripheral region, a second peripheral region, a third peripheral region, and a fourth peripheral region respectively adjacent to the first side surface, the second side surface, the third side surface, and the fourth side surface,
wherein the first peripheral region, the second peripheral region, the third peripheral region, and the fourth peripheral region each comprise a first unit region that includes a plurality of first bumps of a first bump density, and a second unit region that includes a plurality of second bumps of a second bump density higher than the first bump density, and
wherein the central region comprises a plurality of third bumps of a third bump density equal to the second bump density.

18. The semiconductor chip of claim 17, further comprising:
a first peripheral connection region that connects the first peripheral region to the third peripheral region;
a second peripheral connection region that connects the first peripheral region to the fourth peripheral region;
a third peripheral connection region that connects the second peripheral region to the third peripheral region; and
a fourth peripheral connection region that connects the second peripheral region to the fourth peripheral region.

19. The semiconductor chip of claim 17, wherein the first peripheral region, the second peripheral region, the third peripheral region, and the fourth peripheral region each comprise a plurality of first unit regions and a plurality of second unit regions, and
wherein the plurality of first unit regions and the plurality of second unit regions are sequentially and repeatedly arranged along the first side surface, the second side surface, the third side surface, and the fourth side surface.

20. The semiconductor chip of claim 17, further comprising:
first to fourth corner regions adjacent to corners of the chip body, wherein the first to fourth corner regions each comprise a plurality of fourth bumps of a fourth bump density equal to the second bump density.

* * * * *